United States Patent [19]
Kawam

[11] Patent Number: 5,898,239
[45] Date of Patent: Apr. 27, 1999

[54] AUTOMATIC ELECTRONIC BYPASS POWER SWITCH

[75] Inventor: Elias Anthony Kawam, Lawrenceville, N.J.

[73] Assignee: Lockhead Martin Corp., Sunnyvale, Calif.

[21] Appl. No.: 09/012,988

[22] Filed: Jan. 26, 1998

[51] Int. Cl.$^6$ ................................................ H01M 2/34
[52] U.S. Cl. ................... 307/130; 307/125; 320/134; 324/433; 429/61
[58] Field of Search ................................ 307/125, 130; 320/134, 163; 429/90, 61; 324/433

[56] References Cited

U.S. PATENT DOCUMENTS

| | | | |
|---|---|---|---|
| 3,846,679 | 11/1974 | Jost et al. | 317/132 |
| 4,935,315 | 6/1990 | Herrin | 429/61 |
| 5,180,641 | 1/1993 | Burns et al. | 429/61 |
| 5,258,244 | 11/1993 | Hall et al. | 429/90 |
| 5,510,598 | 4/1996 | Kawam et al. | 219/505 |
| 5,650,240 | 7/1997 | Rogers | 429/90 |
| 5,689,209 | 11/1997 | Williams et al. | 327/425 |

*Primary Examiner*—Albert W. Paladini
*Attorney, Agent, or Firm*—C. A. Berard; W. H. Meise; R. P. Kennedy

[57] ABSTRACT

In a multi-cell battery, an open-circuit failure of any one cell renders the entire battery unusable. An automatic electronic bypass switch is connected across each battery cell to provide a low-resistance conductive path around such battery cell should it fail. Contrary to conventional usage in which a fuse is employed to "clear" or "open" a short-circuit condition, the electronic switch of the present invention employs a fuse to activate a highly conductive path, which ideally would approach a short circuit, around an open-circuit condition. The electronic switch includes a field-effect transistor connected across the battery cell and a fuse to hold the field-effect transistor in the "off" condition. Diodes connected between the field-effect transistor and the fuse provide a current path for battery charging and/or discharging current to open the fuse if the battery cell fails open circuit, thereby allowing the field-effect transistor to turn to the "on" condition becoming a conductive path in parallel with the failed battery cell. An electronic switch is preferably connected across each cell of a multi-cell battery.

18 Claims, 3 Drawing Sheets

AUTOMATIC ELECTRONIC BYPASS POWER SWITCH

The present invention relates to electronic power switches, and in particular to electronic switches that are automatically actuated.

Where batteries having a plurality of series-connected cells are employed in locations where maintenance and repair are difficult or impossible, there is the possibility that the degradation or failure of a single battery cell will permanently render the entire battery useless. This is so even where the system utilizing the battery is designed to operate with one or more of the battery's cells having lost its energy storage capacity. Of most concern is the situation where a cell comes to have a high resistance or be an open circuit.

Conventional solutions to that problem include connecting networks of electronic diodes in parallel to the battery cell to conduct the battery charge and discharge currents around the open-circuited battery cell so that the remainder of the battery may continue to be utilized. But these battery cell bypass diodes tend to dissipate substantial power when conducting battery charging and discharging current around a failed battery cell. It is often difficult to remove the resulting heat safely, even if the added weight, cost and complexity of the required thermal heat sinks are tolerable.

An alternative is to utilize a relay to short out the offending open-circuited battery cell, but in most applications, the weight, cost and complexity of a high-current relay and its associated actuation circuitry are not tolerable.

Another alternative device utilizes the heat produced by battery cell bypass diodes to actuate another device, such as a shape memory metal element, to actuate a set of mechanical switch contacts, as is described in U.S. Pat. No. 5,510, 598, entitled "Electro-Thermally Actuated Switch" issued Apr. 23, 1996 to Kawam et al., which is incorporated herein by reference.

In applications where relatively smaller battery systems are employed, i.e. those in which the battery currents may be relatively low, e.g., in the 5 to 10 ampere range, the lesser amount of heat that would be produced by conventional battery bypass diodes would make the thermal design much more difficult and the weight, volume and cost of electro-mechanical relays and/or thermal heat sinks remain undesirable. What is needed is a switch that is lightweight and does not dissipate significant power when it is conducting, yet will operate in applications where there are relatively low currents to be switched. The need is particularly acute in simpler, low-cost systems where only a single battery is employed, or where the reliability of electronic devices is desired.

In the present invention, a switch comprises a semiconductor device having a controllable current conducting path between first and second electrodes that are connected across a current-conducting workpiece. The semiconductor device has a control electrode for controlling the conduction of current in its current conducting path. A fusible conductive element coupled between the first and control electrodes of said semiconductor device renders the semiconductor device non-conductive. A first diode is connected between the second and control electrodes of the semiconductor device for conducting sufficient current to the fusible element to cause the fusible element to open circuit when the potential across the workpiece exceeds a first predetermined threshold level.

Figure 1:
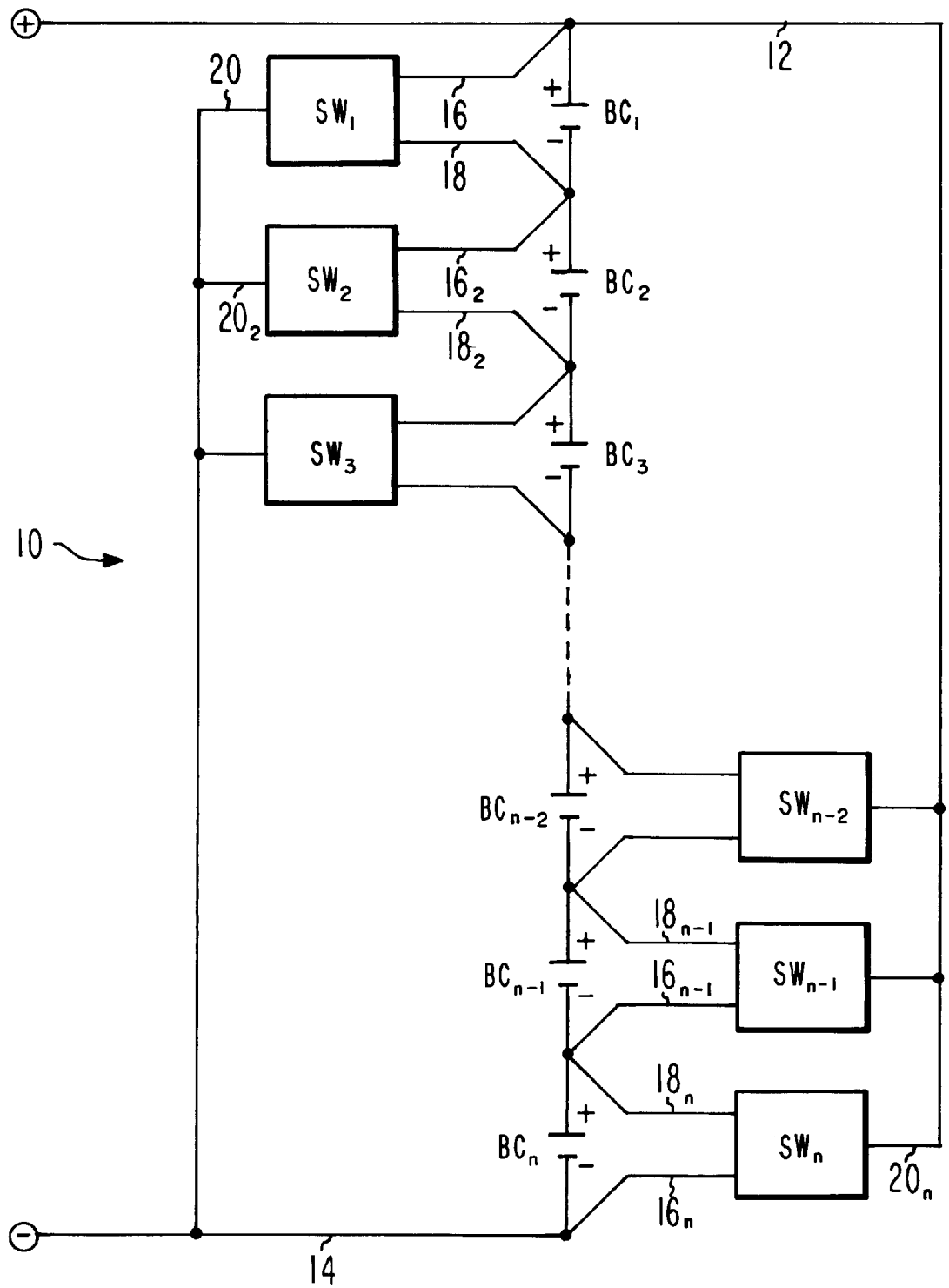
FIG. 1 is an electrical schematic diagram of a battery and switch according to the present invention.

In FIG. 1, multi-cell battery 10 includes a plurality of battery cells $BC_1$, $BC_2$, $BC_3$, ... $BC_{n-2}$, $BC_{n-1}$, $BC_n$, connected in series between positive terminal 12 and negative terminal 14. Across each battery cell $BC_1$, $BC_2$, $BC_3$ ... $BC_{n-2}$, $BC_{n-1}$, $BC_n$, between the positive (+) and negative (−) terminals thereof, is connected a switch $SW_1$, $SW_2$, $SW_3$, ... $SW_{n-2}$, $SW_{n-1}$, $SW_n$, respectively.

In operation, battery 10 is charged by current applied from an external source (not shown) to flow through the series connection of all its cells $BC_1$, $BC_2$, ... $BC_n$, from positive terminal 12 to negative terminal 14, as is conventional. When a load is connected between terminals 12 and 14 that requires sufficient current to cause battery 10 to discharge, the discharging current flows through the series connection of all the cells $BC_1$, $BC_2$, ... $BC_n$, of battery 10 from negative terminal 14 to positive terminal 12, as is conventional.

Thus, if any one or more of the cells of battery 10 were to exhibit a high resistance or become open circuited, it would not be possible for sufficient charging or discharging current to flow in battery 10 for it to serve usefully as a battery. Accordingly, it is desirable to have available a controllable conductive path in parallel with each cell of battery 10 that will become conductive if and when such high resistance or open circuit condition occurs.

To this end, each switch $SW_1$ $SW_2$, $SW_3$, ... $SW_{n-2}$, $SW_{n-1}$, $SW_n$ includes a controllable conduction path between the conductors that connect it to a battery cell (e.g., conductors 16 and 18 that connect switch $SW_1$ across battery cell $BC_1$, conductors 16n and 18n that connect switch $SW_n$ across battery cell $SW_n$, etc.). The controllable conduction path becomes conductive if and when the battery cell across which it is connected exhibits high resistance or an open circuit. In addition, each switch $SW_1$, $SW_2$, ... $SW_n$, has a conductor 20, $20_2$, ... $20_n$ that provides a connection to a source of bias potential to maintain each respective switch conductive once it has become conductive. For the switches that are connected across battery cells connected in the series connection of battery 10 closer to the positive terminal 12, e.g., cells $BC_1$, $BC_2$, $BC_3$, that source of bias potential may be negative terminal 14. For the switches that are connected across battery cells connected in the series connection of battery 10 closer to the negative terminal 14, e.g., cells $BC_{n-2}$, $BC_{n-1}$, $BC_n$, that source of bias potential may be positive terminal 12.

Figure 2A:
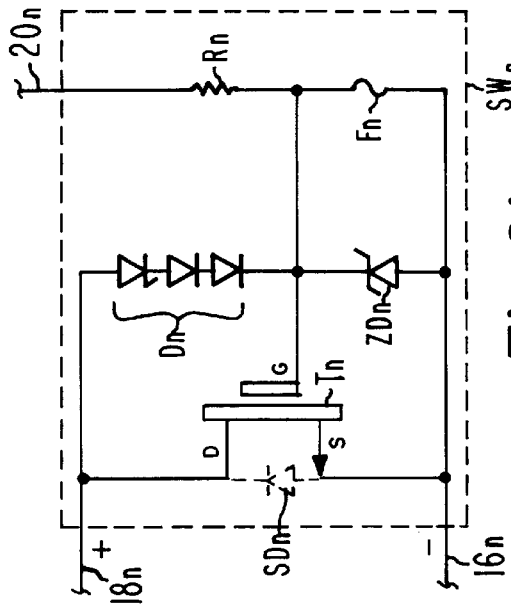
FIGS. 2a and 2b are electrical schematic diagrams of embodiments of switches of the present invention.

FIG. 2a shows a circuit schematic diagram of switch $SW_1$, for example, which would be the same circuit arrangement as that for other switches $SW_2$, $SW_3$, i.e. those connected across those battery cells $BC_2$, $BC_3$, which are connected in the series connection of battery 10 closer to positive terminal 12. Field-effect transistor T1 is a semiconductor device that has a controllable conduction path between its drain and source electrodes which respectively connect to conductors 16 and 18, i.e. across battery cell $BC_1$. The conduction of that controllable conductive path is controlled in response to the potential applied to the gate electrode of field-effect transistor T1, which electrode is maintained at a high potential by the low resistance of fusible element F1 to keep field-effect transistor T1 in its "off" condition.

Contrary to conventional usage in which a fuse is employed to "clear" or "open" a short-circuit condition, the electronic switch of the present invention employs a fuse to activate a highly conductive path, which ideally would approach a short circuit, around an open-circuit condition.

Fusible element F1 is selected to open at a level of current that is less than the lowest of the values of the battery charging current over the range of expected operating conditions that the battery 10 will experience. The current that flows through resistor R1 and the leakage current through diode D1 are small and are well below the rated clearing current of fusible element F1. For example, in a system having battery charging and discharging currents in the range of 2 to 20 amperes, fuse F1 would be selected to clear in the range of 0.5 to 1 ampere. The total of small currents flowing through R1 and D1 would be less than 10 milliamperes.

Diode D1 is connected between the gate and drain electrodes of field-effect transistor T1 and is thereby connected across battery cell $BC_1$ in series connection with fuse F1 and conductors 16 and 18. Diode D1 may include a number of p-n junction diodes connected in series, for example, three, so that it does not conduct over the normal range of voltages at the terminals of a battery cell, e.g., $BC_1$, during operation, both in charge and in discharge. In other words, the forward conduction threshold voltages of the three p-n diodes forming diode D1 establish a predetermined threshold voltage that must be exceeded before diode D1 conducts current.

If a battery cell develops a high resistance or an open circuit condition, then the voltage across its terminals will no longer be established by the galvanic condition within the battery cell, but will be established by the external voltage sources and resistances in circuit with that "failed" cell.

If battery 10 is being charged, the voltage across the failed battery cell will increase to approximately that of the charging source less the open-circuit voltages of the other battery cells. This voltage across the failed battery cell exceeds the conduction threshold voltage of diode D1 which will become conductive to conduct the battery charging current through fuse F1, causing fuse F1 to open. Once fuse F1 opens, the gate-to-source electrode voltage of field-effect transistor T1 increases causing it to turn "on" and the controllable conduction path between its source and drain electrodes to become conductive, thereby providing a low resistance conduction path in parallel with the failed battery cell $BC_1$ to carry the aforesaid charging current. The potential at the gate electrode of field-effect transistor T1 is then held at a level sufficient to maintain conduction between its source and drain electrodes by the potential on conductor 20 being applied to its gate electrode through a conductive element such as resistor R1. Zener diode ZD1 limits the gate-to-source electrode voltage of field-effect transistor T1, such as to about 10 volts.

If battery 10 is in discharge, then the voltage across the failed battery cell will be the sum of the voltages of all the other battery cells as divided across the relatively lower resistance of the load and the higher resistance or open circuit characteristic of the failed battery cell. Because the failed battery cell is now acting as part of the load rather than of the battery as source, the polarity of the potential across the failed battery cell will reverse in polarity from that normally established by the galvanic operation of the battery cell. This reverse-polarity potential is sufficient to overcome the conduction threshold potential of substrate diode SD1, which is a diode inherent in the substrate of field-effect transistor T1 as a result of its construction. Because substrate diode SD1 is now forward biased, the battery discharging current flows through substrate diode SD1 and around the failed battery cell $BC_1$.

Figure 2B:
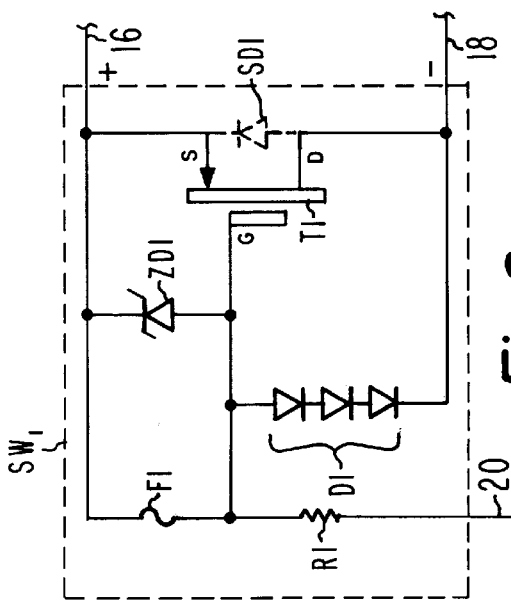

FIG. 2b shows a circuit schematic diagram of switch $SW_n$, for example, which would be the same circuit arrangement as that for other switches $SW_{n-1}$, $SW_{n-2}$, i.e. those connected across those battery cells $BC_{n-1}$, $BC_{n-2}$, which are connected in the series connection of battery 10 closer to negative terminal 14. Field-effect transistor Tn has a controllable conduction path between its source and drain electrodes which respectively connect to conductors 16n and 18n, i.e across battery cell $BC_n$. Field-effect transistor Tn is of opposite polarity type to that of field-effect transistor T1 (i.e. T1 is an N-channel field-effect transistor and Tn is a P-channel field-effect transistor) so it is operable with the potentials and current polarities available at those battery cells closer to negative terminal 14. Circuit elements Dn, Fn, Rn, Tn and ZDn of switch $SW_n$ are connected similarly so as to operate similarly to corresponding elements D1, F1, R1, T1 and ZD1 of switch $SW_1$ as previously described above in relation to FIG. 2a. For example, if battery cell $BC_n$ becomes open circuited, diode Dn conducts charging current when battery 10 is being charged and substrate diode SDn of field-effect transistor Tn conducts discharging current when battery 10 is being discharged, until fuse Fn clears and the voltage on the gate electrode of field-effect transistor Tn increases to render its source-to-drain path conductive in parallel with the failed battery cell $BC_n$.

Accordingly, each switch $SW_1$ $SW_2$, $SW_3$ . . . $SW_n$ becomes conductive automatically, i.e. without outside intervention, in response to the battery cell across which it is connected exhibiting a high-resistance or open circuit condition.

Figure 3A:
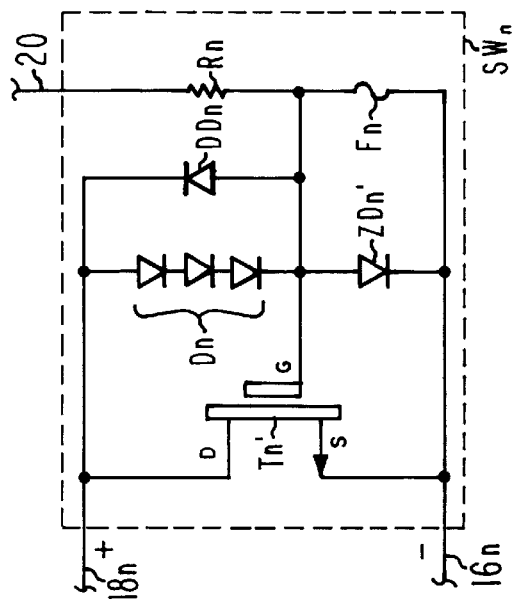
FIGS. 3a and 3b are electrical schematic diagrams of alternative embodiments of switches of the present invention.
Figure 3B:
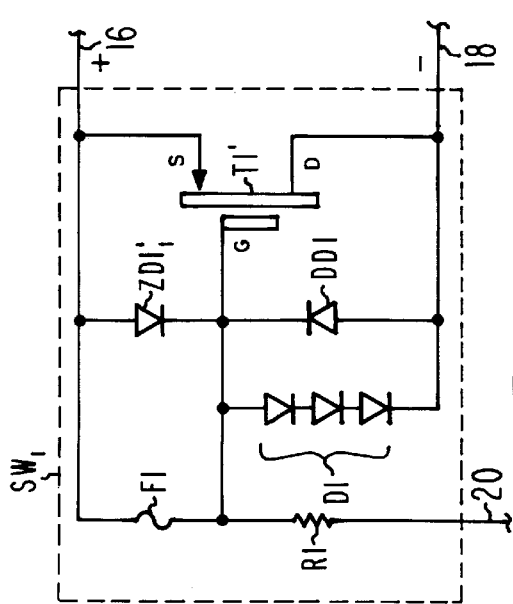

FIGS. 3a and 3b show switches $SW_1$ and $SW_n$ employing circuitry similar to that shown in FIGS. 2a and 2b except that these embodiments employ complementary heterojunction field-effect transistors T1' and Tn', respectively, in place of conventional field-effect transistors T1 and Tn. Complementary heterojunction field-effect transistors are fabricated of Gallium Arsenide semiconductor material and have inherent gate-to-source and gate-to-drain diodes, but no drain-to-source substrate diode. Because the gate-to-source potential necessary to render the drain-to-source conduction path of these complementary heterojunction field-effect transistors conductive is approximately 0.5 volt, the voltages appearing across a failed battery cell when the battery 10 is being discharged are sufficient to render such conduction path conductive, thereby providing a conductive path for the discharge current of battery 10 around the failed battery cell.

Complementary heterojunction field-effect transistors suitable for application in the embodiment of the present invention described herein are available from Honeywell, Incorporated, of Minneapolis, Minn.

Where applicable, reference designations corresponding to those in the foregoing descriptions of the switches $SW_1$ and SWn of FIGS. 2a and 2b will be used in the descriptions relating to FIGS. 3a and 3b for ease of comparison to those descriptions.

FIG. 3a shows a circuit schematic diagram of switch $SW_1$, for example, which would be the same circuit arrangement as that for other switches $SW_2$, $SW_3$, i.e. those connected across those battery cells $BC_2$, $BC_3$, which are connected in the series connection of battery 10 closer to positive terminal 12, as described above in relation to switch $SW_1$ of FIG. 2a.

If battery 10 is being charged, as described above, the voltage across the failed battery cell will increase to exceed the conduction threshold voltage of diode D1 which will then conduct the battery charging current through fuse F1, causing fuse F1 to open and field-effect transistor T1 to turn "on," i.e. to become conductive, thereby providing a low resistance conduction path in parallel with the failed battery cell $BC_1$ to carry the aforesaid charging current. The potential at the gate electrode of field-effect transistor T1 is then maintained at a level sufficient to maintain conduction between its source and drain electrodes by the potential on conductor 20 being applied to its gate electrode through a conductive element such as resistor R1. Diode ZD1', which can be a forward biased junction diode, limits the gate-to-source electrode voltage of complementary heterojunction field-effect transistor T1', such as to a level of about 0.7 volt. This is substantially the same as described above in relation to FIG. 2a.

If battery 10 is in discharge, as described above, the potential across the failed battery cell will reverse in polarity from that normally established by the galvanic operation of the battery cell. This reverse-polarity potential is sufficient to overcome the conduction threshold potential of discharge diode DD1, which is now forward biased and allows the battery discharging current to flow through diode DD1 and fuse F1, causing fuse F1 to open. Once fuse F1 opens, the gate-to source electrode voltage of complementary heterojunction field-effect transistor T1' increases sufficiently to cause it to turn "on" and maintain conduction between its source and drain electrodes as described in the preceding paragraphs.

FIG. 3b shows a circuit schematic diagram of switch $SW_n$, for example, which would be the same circuit arrangement as that for other switches $SW_{n-1}$, $SW_{n-2}$, i.e. those connected across those battery cells $BC_{n-1}$, $BC_{n-2}$, which are connected in the series connection of battery 10 closer to negative terminal 14. Complementary heterojunction field-effect transistor Tn' has a controllable conduction path between its source and drain electrodes which respectively connect to conductors 16n and 18n, i.e across battery cell $BC_n$. Field-effect transistor Tn' is of opposite polarity type to that of field-effect transistor T1' (i.e. T1' is an N-channel field-effect transistor and Tn' is a P-channel field-effect transistor) so it is operable with the potentials and current polarities available at those battery cells closer to negative terminal 14. Circuit elements Dn, Fn, Rn, DDn, Tn' and ZDn' of switch $SW_n$ of FIG. 3b are connected similarly so as to operate similarly to corresponding elements D1, F1, R1, DD1, T1' and ZD1' of switch $SW_1$ as previously described above in relation to FIG. 3a. For example, if battery cell $BC_n$ becomes open circuited, diode Dn conducts charging current when battery 10 is being charged and diode DDn conducts discharging current when battery 10 is being discharged, until fuse Fn clears and the voltage on the gate electrode of field-effect transistor Tn' increases to render its source-to-drain path conductive in parallel with the failed battery cell $BC_n$.

Accordingly, each switch $SW_1$, $SW_2$, $SW_3$ . . . $SW_n$ becomes conductive automatically, without outside intervention, in response to the battery cell across which it is connected exhibiting a high-resistance or open circuit condition.

Figure 4:
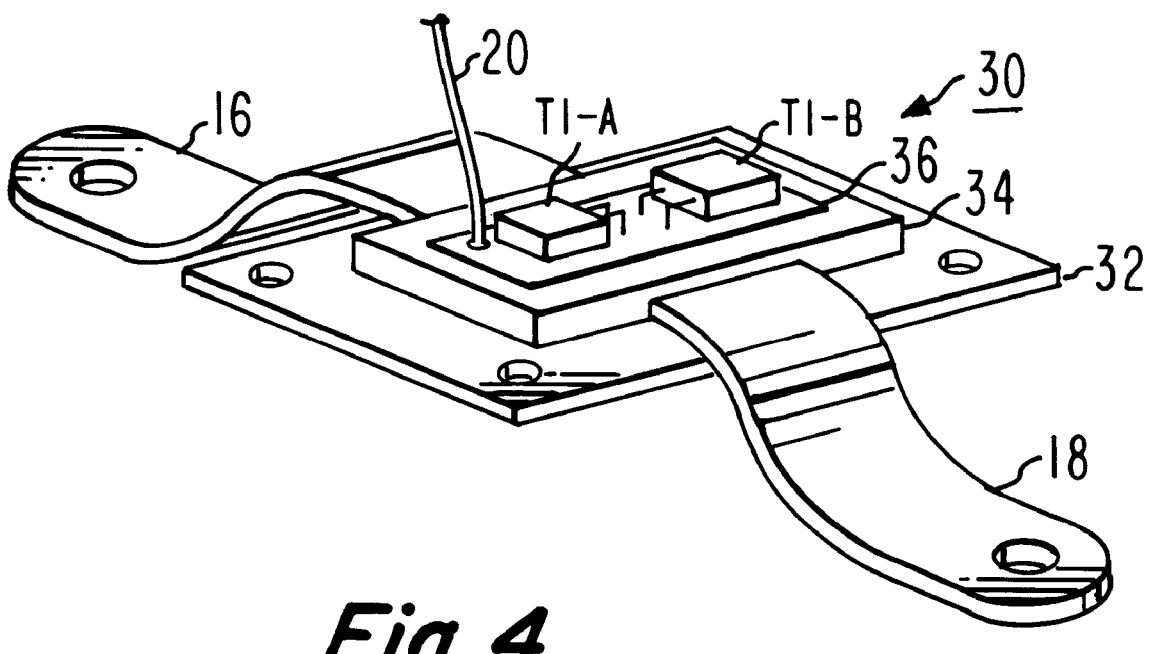
FIG. 4 is a diagram of a physical embodiment of the present invention.

FIG. 4 shows a physical embodiment of an electrical circuit module 30 suitable for the construction of switches $SW_1$, $SW_2$, . . . $SW_n$. Where applicable, reference designations corresponding to those used in the above descriptions of switch $SW_1$ will be used for ease of comparison to those descriptions. Module 30 includes a mounting plate 32 which is fabricated of metal, such as copper, aluminum, brass or steel, or other suitable material. Mounting plate 32 may, in addition to facilitating mounting of module 30, also provide a thermal path for conducting the heat generated by field-effect transistor T1 or T1'.

A mounting frame 34, which is fabricated of insulating material, for example, ceramic, beryllium oxide, G-10 glass-fiber epoxy, nylon, or polyesterimide, is affixed to mounting plate 32 for supporting electronic circuit board 36 and for interconnecting circuit board 36 and conductors 16 and 18. Conductors 16 and 18 may be conventional electrical wire, or may be copper or aluminum straps or bus bars as shown, of sufficient cross-section to safely conduct the highest charging and discharging currents of battery 10.

Circuit board 36 includes an insulating substrate having printed circuit conductors thereon that interconnect the electronic components, such as diodes D1, and ZD1, fuse F1, resistor R1 and transistor T1 or T1' mounted thereon. Circuit board 36 may be fabricated of G-10 fiber-glass epoxy, ceramic, polyimide or other conventional material, and the components thereon may be discrete components or surface-mount devices, as convenient. In the arrangement shown in FIG. 4, transistor T1, for example, is shown as two transistors T1A and T1B which would have their respective source-to-drain conduction paths connected in parallel either to increase the total current-carrying capacity of switch $SW_1$ or to increase its reliability through the redundancy of parallel paths.

While the present invention is described in relation to the foregoing exemplary embodiments, the invention is limited only by the claims following which are intended to encompass variations as would be understood by those of skill in the art. For example, in FIG. 1, conductor 20 to a source of potential at terminal 14 may be connected to any suitable potential, such as that at the positive terminal of a battery cell $BC_{n-2}$, $BC_{n-1}$ or $BC_n$, and conductor 20n could similarly be connected to a terminal of battery cell $BC_1$, $BC_2$ or $BC_3$, or to that available from a power supply or another battery. The conductive element described as resistor $R_1$, $R_2$ . . . $R_n$ could also be a field-effect transistor, a current-regulating diode, or an inductor.

In addition, fusible element F1 could be a conventional electrical fuse or a length of fuse wire or of fine copper or aluminum wire or a printed circuit conductor, such as one having a portion of its length narrowed. Where increased reliability is desired, multiple elements could be employed, such as by parallel fuses for fuse F1, by networks of series-and/or parallel-connected diodes for diodes D1, D2 and/or ZD1.

What is claimed is:

1. A switch comprising:

first and second conductors for connecting to a current-conducting workpiece;

a controlled conduction semiconductor device having first and second electrodes and a controllable current conducting path therebetween, said first and second electrodes being respectively connected to said first and second conductors, said semiconductor device having a control electrode for controlling the conduction of current in said controllable current conducting path;

a fusible conductive element coupled between the first and control electrodes of said semiconductor device for maintaining said semiconductor device non-conductive;

a first diode connected between the second and control electrodes of said semiconductor device for conducting sufficient current to said fusible conductive element to cause said fusible conductive element to open circuit when the potential between said first and second conductors exceeds a first predetermined threshold level.

2. The switch of claim 1 further comprising a conductive element coupling the control electrode of said semiconductor device to a source of potential to render the controllable conduction path of said semiconductor device conductive when said fusible conductive element is open circuit.

3. The switch of claim 1 further comprising a second diode connected between the second and control electrodes of said semiconductor device, and poled oppositely to said first diode, for conducting sufficient current to said fusible conductive element to cause said fusible conductive element to open circuit when the potential between said first and second terminals exceeds a second predetermined threshold level.

4. An electronic switch comprising:

first and second terminals for connecting to a battery cell;

a controlled conduction field-effect transistor having source and drain electrodes and a controllable current conducting path therebetween, said source and drain electrodes being respectively connected to said first and second terminals, said field-effect transistor having a gate electrode for controlling the conduction of current in said controllable current conducting path;

a fusible conductive element coupled between the source and gate electrodes of said field-effect transistor for maintaining said field-effect transistor non-conductive;

a first diode connected between the drain and gate electrodes of said field-effect transistor for conducting sufficient current to said fusible conductive element to cause said fusible conductive element to open circuit when the potential between said first and second terminals exceeds a first predetermined threshold level.

5. The electronic switch of claim 4 wherein said first diode includes a plurality of p-n junction diodes in series connection.

6. The electronic switch of claim 4 further comprising a second diode connected between the drain and gate electrodes of said field-effect transistor, and poled oppositely to said first diode, for conducting sufficient current to said fusible conductive element to cause said fusible conductive element to open circuit when the potential between said first and second terminals exceeds a second predetermined threshold level.

7. The electronic switch of claim 4 wherein said field-effect transistor includes a complementary heterojunction field-effect transistor.

8. The electronic switch of claim 4 further comprising a current conductive element coupling the control electrode of said semiconductor device to a source of potential to render the controllable conduction path of said field-effect transistor conductive when said fusible conductive element is open circuit.

9. The electronic switch of claim 8 wherein said current conductive element includes a resistive element for coupling the gate electrode of said field-effect transistor to said source of potential.

10. A battery comprising:

a plurality of battery cells in series connection between first and second terminals;

a plurality of electronic switches, each said electronic switch being connected across a respective one of said plurality of battery cells;

wherein each said electronic switch comprises:

a controlled conduction field-effect transistor having source and drain electrodes and a controllable current conducting path therebetween, said source and drain electrodes being respectively connected across said battery cell for providing a controllable current conducting path in parallel therewith, said field-effect transistor having a gate electrode for controlling the conduction of current in said controllable current conducting path;

a fusible conductive element coupled between the source and gate electrodes of said field-effect transistor for maintaining said field-effect transistor non-conductive; and a first diode connected between the drain and gate electrodes of said field-effect transistor for conducting sufficient current to said fusible conductive element to cause said fusible conductive element to open circuit when the potential across said battery cell exceeds a first predetermined threshold level.

11. The battery of claim 10 wherein said first diode includes a plurality of p-n junction diodes in series connection.

12. The battery of claim 10 wherein said field-effect transistor includes a complementary heterojunction field-effect transistor.

13. The battery of claim 10 wherein the first predetermined threshold associated with one of said electronic switches exceeds the galvanic potential of the respective one of said plurality of battery cells to which said one of said electronic switches is connected.

14. The battery of claim 10 wherein said electronic switch further comprises a second diode connected between the drain and gate electrodes of said field-effect transistor, and poled oppositely to said first diode, for conducting sufficient current to said fusible conductive element to cause said fusible conductive element to open circuit when the potential between said first and second terminals exceeds a second predetermined threshold level.

15. The battery of claim 14 wherein said second predetermined threshold level is of opposite polarity to that of said first predetermined threshold level.

16. The battery of claim 10 wherein said electronic switch further comprises a current conductive element coupling the control electrode of said semiconductor device to a source of potential to render the controllable conduction path of said field-effect transistor conductive when said fusible conductive element is open circuit.

17. The battery of claim 16 wherein said current conductive element includes a resistive element for coupling the gate electrode of said field-effect transistor to said source of potential.

18. The battery of claim 17 wherein the battery cell to which said electronic switch is connected is electrically connected in said series connection of battery cells nearer to said first terminal than to said second terminal, and wherein said source of potential includes said second terminal.

* * * * *

UNITED STATES PATENT AND TRADEMARK OFFICE
CERTIFICATE OF CORRECTION

PATENT NO. : 5,898,239
DATED : April 27, 1999
INVENTOR(S) : Elias Anthony Kawam

It is certified that error appears in the above-identified patent and that said Letters Patent is hereby corrected as shown below:

<u>Title page,</u>
Item [73], change "Lockhead Martin Corp." to -- Lockheed Martin Corp. --.

Signed and Sealed this

Second Day of April, 2002

Attest:

JAMES E. ROGAN
Attesting Officer   Director of the United States Patent and Trademark Office